(12) United States Patent
Davis

(10) Patent No.: US 7,215,859 B2
(45) Date of Patent: May 8, 2007

(54) DIRECT DIODE CONTACT HIGH POWER FIBER OPTIC LASER SYSTEM

(75) Inventor: James A. Davis, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 169 days.

(21) Appl. No.: 10/887,373

(22) Filed: Jul. 6, 2004

(65) Prior Publication Data

US 2006/0008219 A1   Jan. 12, 2006

(51) Int. Cl.
   *G02B 6/02*   (2006.01)
(52) U.S. Cl. .................. 385/123; 385/124; 385/125; 385/126; 385/127
(58) Field of Classification Search ......... 385/123–127
   See application file for complete search history.

(56) References Cited

U.S. PATENT DOCUMENTS

| | | | |
|---|---|---|---|
| 5,887,096 A * | 3/1999 | Du et al. ................. | 385/39 |
| 6,700,697 B2 * | 3/2004 | Nikolajsen et al. ..... | 359/341.32 |
| 7,042,631 B2 * | 5/2006 | Smith et al. ............ | 359/333 |
| 2002/0141718 A1 | 10/2002 | Wang et al. | |
| 2002/0172251 A1 | 11/2002 | Ohtsuka et al. | |
| 2003/0063884 A1 * | 4/2003 | Smith et al. ............ | 385/129 |
| 2004/0067016 A1 | 4/2004 | Anikitchev et al. | |

OTHER PUBLICATIONS

VCSEL (Vertical Cavity Surface Emitting Laser), May 14, 2004, web page http://www.lasermate.com/vcsel.htm.

* cited by examiner

*Primary Examiner*—Jennifer Doan
(74) *Attorney, Agent, or Firm*—MacPherson Kwok Chen & Heid LLP; Greg J. Michelson

(57) ABSTRACT

Embodiments include a fiber optic laser system having at least one optical waveguide with a laseable core and a pump cladding disposed adjacent the lasing core. A source of electromagnetic pumping energy is disposed adjacent to the optical waveguide and has an emission axis that is directed toward the optical waveguide. An optically reflective surface is disposed towards the optical waveguide and may be configured as an enclosure disposed about at least a portion of the optical waveguide. An index matching material may be disposed within the enclosure and in contact with at least a portion of the optical waveguide.

28 Claims, 10 Drawing Sheets

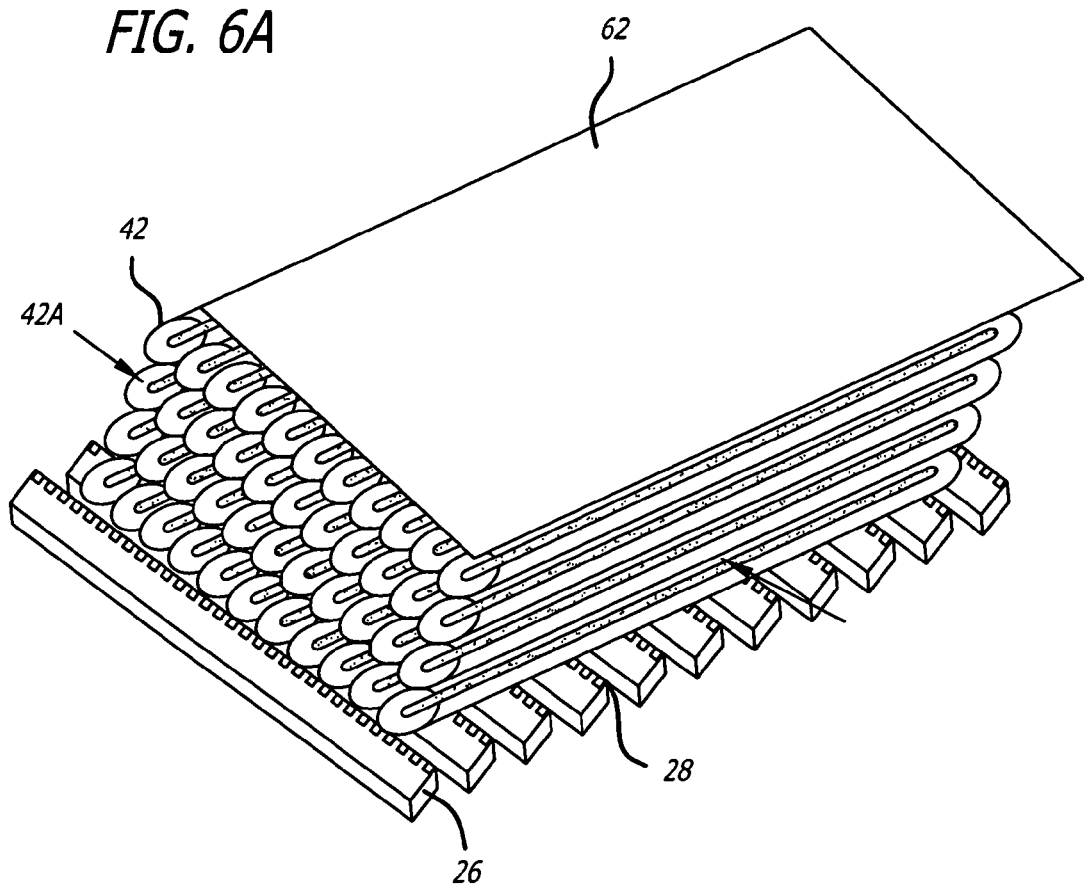

DIRECT DIODE CONTACT HIGH POWER FIBER OPTIC LASER SYSTEM

BACKGROUND

Solid state lasers are currently in use and have many desirable qualities with regard to compactness, robustness and reliability. They also are capable of producing high optical to optical conversion efficiency and, thus, have the potential for producing high energy output. These fiber optic lasers have a multitude of applications including, for example, industrial, military and medical technologies.

Such devices, however, have shortcomings that may make their application impractical in many instances. For example, most known fiber optic lasers that are powered or pumped by solid state devices, such as diode lasers, require multiple optical components to be aligned and positioned relative to each other with a high degree of accuracy. For example, many edge emitting diode lasers used to pump the core of a fiber optic laser element use a cylindrical lens on the output of the diode laser to collimate the divergent output of the diode laser and focus the energy onto the fiber optic element. The fixturing and alignment of these components can be tedious and expensive to produce.

Also, one coupling method in use involves focusing the energy from a number of diode laser emitters onto the small end surface of a fiber optic laser. This technique can produce high temperatures and energy related stresses on the input end surface of the optical fiber. Such temperatures and stresses can result in damage to the fiber input that can reduce efficiency and potentially destroy the fiber altogether. Other methods incorporate multiple fiber optic waveguides that individually guide pumping energy from a number of individual diode lasers to the input end of a fiber optic laser having a laseable core. As such, the energy from the individual fiber optic waveguides can then be coupled to the pump cladding surrounding the laseable core. Such an arrangement, in addition to being tedious and expensive to produce, also produces large optical losses in the optical train from the individual diode lasers to the laseable core of the fiber optic laser. In some embodiments having this configuration, the cumulative optical losses can be up to 60%.

What has been needed are systems for efficiently and reliably coupling electromagnetic energy from a small solid state electronic component, such as a diode laser, into a lasing core of fiber optic element that are easy to manufacture, reliable, efficient and which do not put undue stresses on the optical components therein.

SUMMARY

One embodiment is directed to an optical system having at least one elongate optical waveguide with a first end, a second end, a lateral outer surface, an elongate laseable core disposed therein which is substantially parallel to a longitudinal axis of the elongate optical waveguide and a pump cladding disposed on the laseable core. A source of electromagnetic pumping energy is disposed adjacent to the optical waveguide and has an emission axis that is directed toward the lateral outer surface of the optical waveguide. An optically reflective surface is disposed towards the lateral outer surface of the elongate optical waveguide. In some embodiments, the reflective surface is configured as an enclosure disposed about at least a portion of the at least one optical waveguide and optionally contains an index matching material disposed within the enclosure in contact with at least a portion of the lateral outer surface of the elongate optical waveguide.

Another embodiment is directed to a method of lasing an elongate laseable core that includes providing an optical system having at least one elongate optical waveguide having a first end, a second end, a lateral outer surface, an elongate laseable core disposed therein which is substantially parallel to a longitudinal axis of the elongate optical waveguide and a pump cladding disposed on the laseable core. A source of electromagnetic pumping energy is disposed adjacent to the optical waveguide and has an emission axis that is directed toward the lateral outer surface of the elongate optical waveguide. An optically reflective surface may disposed towards the lateral outer surface of the elongate optical waveguide which is optionally configured as an enclosure disposed about at least a portion of the at least one elongate optical waveguide with an index matching material disposed within the enclosure and in contact with at least a portion of the lateral outer surface of the elongate optical waveguide. Once the optical system is provided, the source of electromagnetic pumping energy is energized to produce an emission output from the source of electromagnetic pumping energy which then penetrates the lateral outer surface of the elongate waveguide, travels to and optically pumps the laseable core which thereafter produces laser energy.

These and other advantages of embodiments will become more apparent from the following detailed description when taken in conjunction with the accompanying exemplary drawings.

BRIEF DESCRIPTION OF THE DRAWINGS

FIG. 6A illustrates an alternative embodiment of the optical system of FIGS. 5 and 6 wherein the optical waveguide sections are disposed in multiple layers over the linear diode laser arrays between the linear diode laser arrays and the reflective surface or surfaces.

DETAILED DESCRIPTION

Sources of electromagnetic energy, such as diode lasers or photodiodes, operating in the visible, near infrared and infrared spectrums, provide a robust and compact means for pumping fiber optic laser devices. The small size of the components for such solid state sources of electromagnetic energy, however, may produce challenges in the construction of optical systems that incorporate them, particularly when systems that require a scaling up of output power are sought. Embodiments herein are directed to devices and methods for pumping fiber optic laser cores with electromagnetic energy from solid state sources that are cost effective to produce and can be scaled to high energy outputs. Embodiments include single fiber systems having lasing output energy in the kilowatt range and systems with multiple fiber optic laser elements having optical output approaching kilowatt levels, for some configurations.

For some embodiments, the pumping energy from the solid state optical pump energy sources is injected at several locations corresponding to the location of each solid state source of electromagnetic pumping energy along a longitudinal length of an elongate optical waveguide that has an elongate laseable core through a lateral outer surface of the elongate optical waveguide. By direct injection of pumping energy through the lateral outer surface of the elongate optical waveguide through the pump cladding and any other optical waveguide structures surrounding the laseable core, more energy can be directed onto the laseable core without producing damage or stresses to the ends of the elongate optical waveguide. In addition, more area is available for positioning sources of electromagnetic pumping energy in close proximity to the laseable core.

Figure 1:
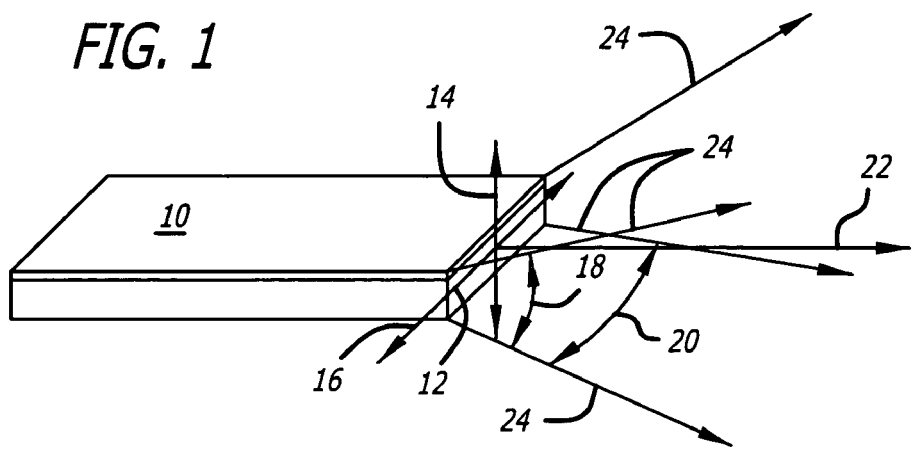
FIG. 1 is a perspective view of a source of electromagnetic energy in the form of an edge emitting diode laser.

FIG. 1 is a perspective view of a source of electromagnetic energy in the form of an edge emitting diode laser 10 having an emission surface 12. Transverse divergence axes are indicated by arrows 14 and 16 wherein arrow 14 shows the orientation of the fast axis of the diode laser emission divergence and arrow 16 indicates the orientation of the slow axis of emission. The outer bounds of the emission divergence of the diode laser 10 with respect to the fast axis 14 and slow axis 16 is illustrated by the arrows 18 and 20, wherein arrow 18 indicates the full angle of emission divergence along the fast axis 14 and arrow 20 indicates the full angle of emission divergence from the diode laser 10 along the slow axis 16.

The divergence angles 18 and 20 are functions of the materials, dimensions and geometry of the quantum well of the diode laser 10. A diode laser 10, as shown in FIG. 1, may have a length of several hundred microns, more specifically, about 100 microns to about 1,500 microns. The height and width may be from about 10 microns to about 100 microns, for some embodiments. Such a configuration, wherein the emission surface 12 is somewhat rectangular, may have a fast axis divergence angle 18 of about 25 degrees to about 45 degrees and a slow axis divergence angle 20 of about 6 degrees to about 10 degrees. When the diode laser 10 is energized with electrical energy, the diode laser 10 emits electromagnetic energy from the emission surface 12 along an emission axis 22 in an emission beam generally bounded by emission beam boundary rays 24. The emmision axis is generally disposed at the center of the emission beam as it propegates.

Figure 2:
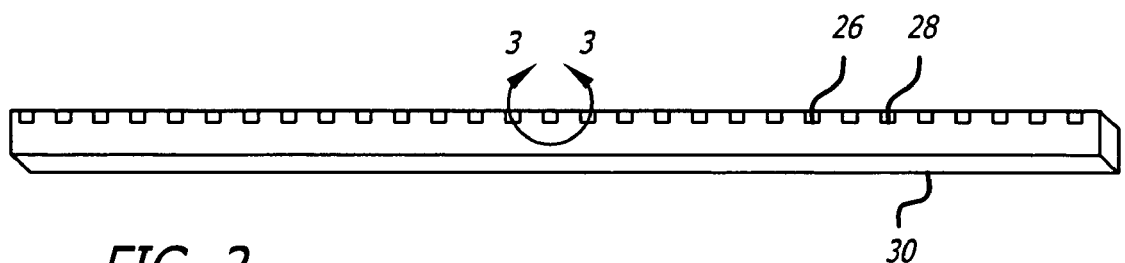
FIG. 2 is a perspective view of a linear array of diode lasers disposed in a semiconductor substrate.
Figure 3:
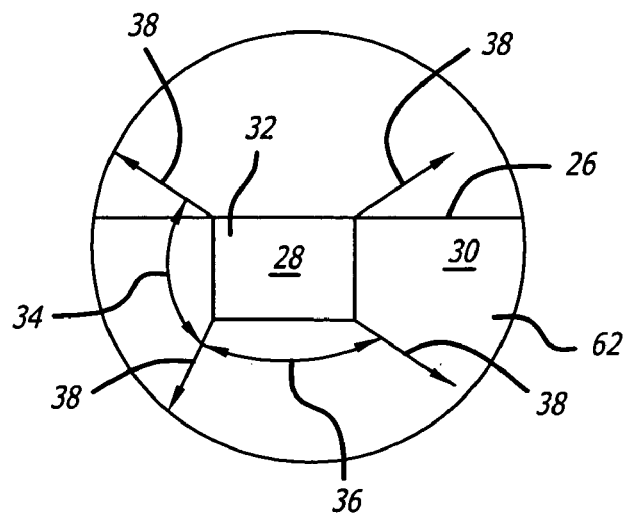
FIG. 3 is an enlarged view of section 3—3 of FIG. 2 illustrating an emission surface of a diode laser of the linear array of diode lasers.

FIGS. 2 and 3 show a linear array of diode lasers 26. The linear array 26 includes multiple diode laser emitters 28 disposed along a common plane on a semiconductor substrate 30. The substrate 30 may have a height and width of about 100 microns to about 1,500 microns, commensurate with the length of the quantum well of the diode laser emitters 28 disposed in the substrate 30. The linear array 26 may have a length of about 1 mm to about 10 mm or more. The diode laser emitters 28 lie along a common plane on a top surface of the linear array with the emission axes of the diode laser emitters being substantially parallel so as to lie in a plane defined thereby. The electromagnetic energy or light emanating from the diode laser emitters 28 diverges in two directions from each diode laser element in a manner similar to that indicated by the emission beam boundary rays 24 shown in FIG. 1. As such, the beams from the diode laser emitters begin to overlap at some distance from the emission surface 32 of the diode laser emitters 28. The linear array 26 shown has a total of 29 diode laser emitters 28, but similar embodiments having the same general structure and materials could also have a greater or lesser number of individual diode laser emitters. For example, in one embodiment of a linear array 26, there are about 5 to about 200 diode laser emitters 28, more specifically, about 10 to about 100 diode laser emitters 28.

The quantum well of the diode laser emitters 28 may have a length of several hundred microns, more specifically, about 100 microns to about 1,500 microns. The height and width of the diode laser emitters 28 may be from about 10 microns to about 100 microns. Embodiments having an emission surface 32 that is somewhat rectangular, may have a fast axis divergence angle indicated by arrow 34 of about 25 degrees to about 45 degrees and a slow axis divergence angle indicated by arrow 36 of about 6 degrees to about 10 degrees. When the diode laser emitters 28 are energized with electrical energy, the diode laser emitters 28 emit electromagnetic energy from the emission surface 32 along an emission axis (not shown) in an emission beam generally bounded by emission beam boundary rays 38.

Figure 4:
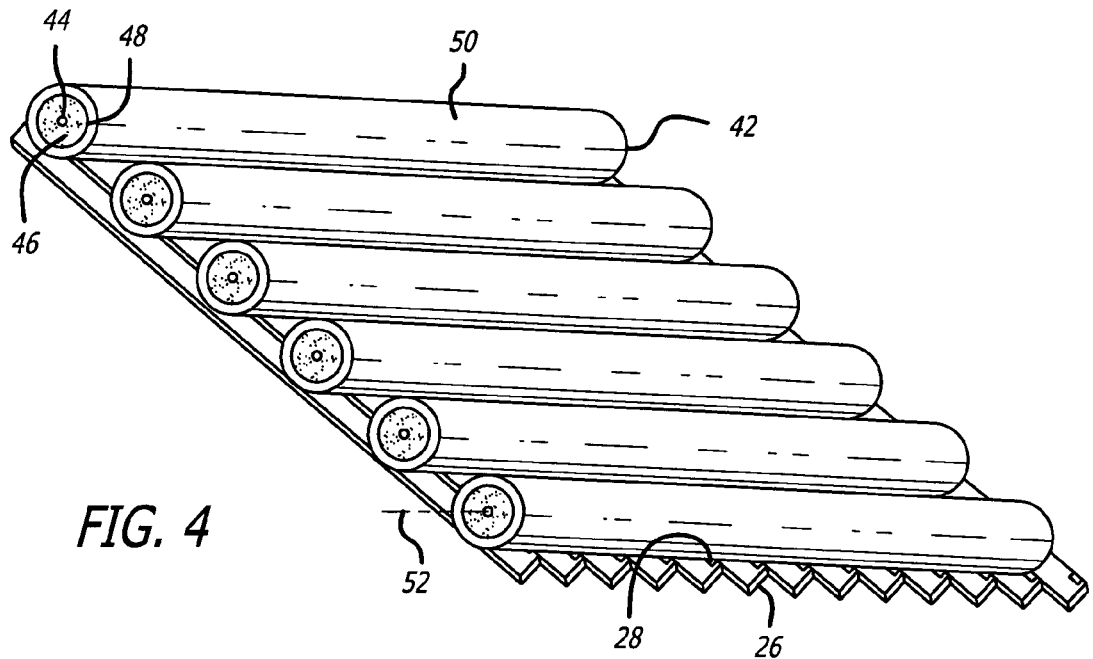
FIG. 4 is a perspective view partially cut away illustrating several optical waveguides disposed over several respective linear diode laser arrays with the fast axis of the individual diode laser emitters of the linear array substantially parallel to a longitudinal axis of the respective waveguides disposed over each of the individual diode lasers of the linear arrays.

FIG. 4 is a perspective view partially cut away illustrating an optical system 41 having several elongate optical waveguide sections 42 disposed over and in close proximity or actual contact with several linear diode laser arrays 26 parallel to each other. The elongate optical waveguide sections 42 are disposed over respective individual diode laser emitters 28 of the linear arrays 26 and have an elongate laseable core 44, a pump cladding 46, a refractive cladding 48 and a lateral outer surface 50 in a fiber optic laser configuration. In the embodiment shown in FIG. 4, the elongate laseable cores 44, pump claddings 46, refractive claddings 48 and lateral outer surfaces 50 of each respective elongate optical waveguide section 42, all have substantially circular transverse cross sections and are disposed substantially concentrically with respect to each other.

The elongate laseable core 44 may be made from any variety of laseable materials, including a doped silica material that is formulated to have a desired index of refraction, to be optically pumped and lased at a desired wavelength or both. In one embodiment, the laseable core is made of fused silica doped with a rare earth ion such as neodymium, ytterbium, praseodymium, erbium, thulium, holmium, and scandium in a concentration of about ten (10) parts per million to about one thousand (1,000) parts per million. The pump cladding 46 may likewise be made from silica material and may also be doped with materials, such as fluorine, aluminum, germanium, phosphate, or other materials in order to achieve a desired index of refraction. The refractive cladding 48 is generally made from silica or another material with similar optical properties and has an index of refraction that is less than the index of refraction of the pump cladding so as to produce a critical angle of total internal reflection described generally by Snell's Law. It is this relationship that produces the waveguide properties of the elongate optical waveguide. Optical rays intersecting the outer surface cladding of the fiber at angles less than the critical angle can transmit through the fiber unless further refracted or scattered by refractive index changes within the fiber. The refractive cladding 48 can also be made from a polymer, such as an acrylate, in order to provide the same optical function and to seal the laseable core 44 and pump cladding 46 from environmental influences and provide mechanical strength to the elongate optical waveguide section 42. Alternatively, if the refractive cladding is made from a silica or silica like material, an additional outer coating (not shown) made from polymers, such as acrylates, could be added to the elongate waveguide structure to provide these enhanced mechanical and protective properties. Alternatively, an all-glass cladding with a refractive index step may be used. In this embodiment, the cladding can also be formed without a refractive index step or gradient so that the optical pump rays may pass from the pump cladding to the outer surface of the fiber.

Although not shown in FIG. 4, the optical system 41 may also include a surface or surfaces at either end of the elongate optical waveguides 42 that are reflective or partially transmissive in order to produce a high efficiency lasing cavity within the laseable core 44 of the waveguide 42. Reflective surfaces may include a Bragg grating that selectively reflects desired wavelengths, such as the lasing wavelength in order to improve the lasing characteristics of the optical system.

The elongate optical waveguide sections 42 are positioned with respect to linear arrays 26 such that a plane defined by the emission axis of a diode laser element 28 and the fast axis of the individual diode laser element 28 is substantially parallel to a longitudinal axis 52 of the respective elongate optical waveguide section 42. This alignment with the fast axis of the individual diode laser emitters 28 generates a large number of reflective modes of light from the diode laser emitters due to the relatively large dispersion angle of the fast axis which may impinge on the elongate optical waveguide along the longitudinal axis 52 thereof facilitating the likelihood of capture of some of the modes by total internal reflection within the pump cladding 46 and refractive cladding 48. The interspersion of an index matching medium between the diode laser emitters and the outer cladding of the fiber can allow direct transmission of the optical pump energy into the fiber in an efficient manner.

In addition, the emission axes of the diode laser emitters 28 may be canted at an angle with respect to the longitudinal axes 44 of the elongate optical waveguide sections 42 to further facilitate total internal reflection within the pump cladding 46. The canting of the emission axes of the diode laser emitters 28 is configured in order to allow injection of emission energy from the diode laser emitters 28 into the lateral outer surface 50 of the elongate optical waveguide sections 42 while facilitating total internal reflection of the emission energy once that energy is moving within the pump cladding 46 of the elongate optical waveguide sections 42.

Figure 5:
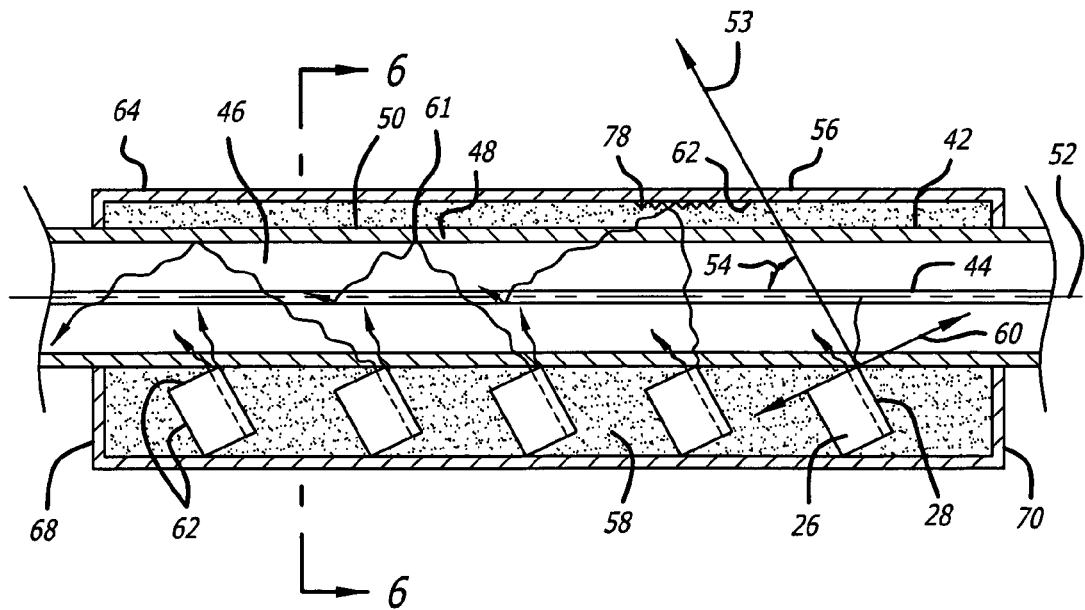
FIG. 5 is an elevational view in partial section and partially cut away of an optical system that includes five linear diode laser arrays disposed adjacent four optical waveguides in a configuration similar to that of the assembly of FIG. 4 wherein the emission axes of the individual diode lasers form an angle as shown with longitudinal axes of the optical waveguides and a reflective enclosure is disposed about the linear diode laser arrays and the adjacent portions of the optical waveguides and includes an optical index material disposed therein.
Figure 6:
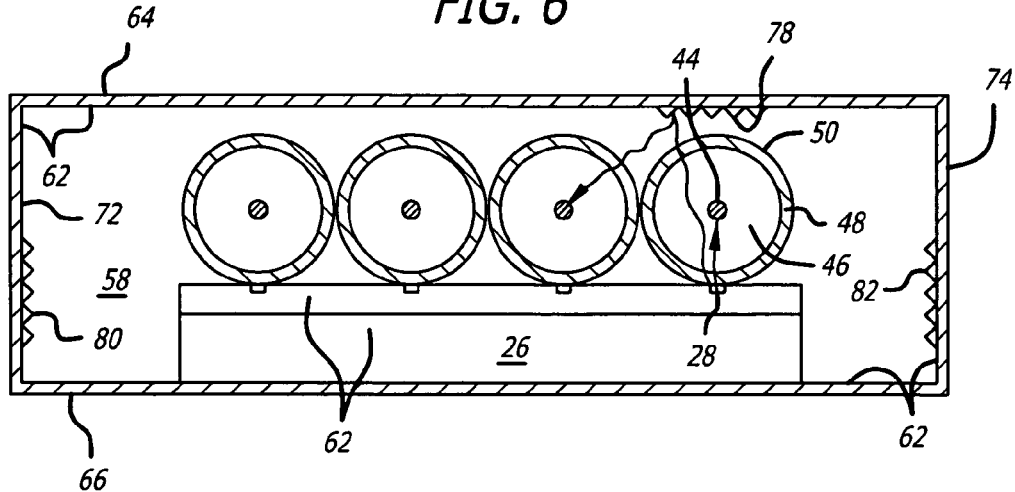
FIG. 6 is a transverse cross sectional view of the optical system of FIG. 5 taken along lines 6—6 of FIG. 5.

FIGS. 5 and 6 show an optical system that includes five linear diode laser arrays 26 disposed adjacent to and in contact with a lateral outer surface 50 of four elongate optical waveguide sections 42 in a configuration similar in some respects to the configuration of the assembly shown in FIG. 4. The emission axes 53 of the individual diode laser emitters 28 form an angle indicated by arrow 54 with longitudinal axes 52 of the elongate optical waveguide sections 42. A reflective enclosure 56 is disposed about the linear diode laser arrays 26 and the adjacent portions of the elongate optical waveguide sections 42 and includes an optical index material 58 disposed therein. The elongate optical waveguide sections 42 are positioned with respect to linear arrays 26 such that a plane defined by the emission axes 53 of a diode laser emitters 28 and the fast axis 60 of the individual diode laser emitters 28 is substantially parallel to a longitudinal axis 52 of the respective elongate optical waveguide sections 42.

Electromagnetic energy or light emanating from the diode laser emitters 28 of the linear arrays 26, as indicated by the serpentine arrow rays in FIG. 5, propagates into the lateral outer surface 50 of the elongate waveguide sections 42 and subsequently advances into the pump cladding 46. Once the energy enters the pump cladding, it may remain trapped in the pump cladding 46 by virtue of total internal reflection at the boundary 61 between the pump cladding 46 and the refractive cladding 48, or impinge upon the laseable core and be absorbed by the laseable core, thereby optically pumping the laseable core. Alternatively, the energy may exit the elongate optical waveguide through the refractive cladding 48 and be reflected by the reflective surface 62 of the reflective enclosure 56.

Electromagnetic energy that passes through the elongate optical waveguide 42 and is not captured by total internal reflection at the boundary 61 may still be confined to the reflective enclosure 56 as the top wall 64, bottom wall 66, front wall 68, back wall 70 and side walls 72 and 74 all have highly reflective internal surfaces 62. The front and back walls 68 and 70 may be sealed to the lateral outer surfaces 50 of the optical waveguide sections 42. Thus, the energy from the diode laser emitters 28 may be confined to the reflective enclosure 56 until it is either absorbed by a component within the enclosure 56 and converted to heat or absorbed by the laseable core 44 and serves to optically pump the laseable core 44. The front wall 68 and back wall 70 form a seal to the lateral outside surface of the elongate optical waveguide sections 42 in order to confine the electromagnetic energy emanating from the diode laser emitters 28 and to confine the index match material 58. The index match material 58 may be a fluid or liquid and have an index of refraction that is substantially the same as that of the refractive cladding 48 or the material or materials which comprise the outer-most coating of the elongate optical waveguide section 42. In some embodiments, index match materials 58 may include chlorofluorocarbon refrigerants, ethylene glycol, electronic coolants such as Fluorinert™, poly-alpha olefins, alcohols, perchloroethylene, carbon tetrachloride, and various combinations thereof.

A reflective optical dispersion surface 78 is shown disposed on a portion of the reflective surface 62 of the top wall 64 of the reflective enclosure 56 in FIG. 5. First and second reflective optical dispersion surfaces 80 and 82 are shown disposed on the inside reflective surface 62 of side walls 72 and 74 respectively. Such reflective dispersion surfaces may be disposed over all or any portion of any of the reflective surface 62 of the wall portions 64, 66, 68, 70, 72 and 74. The optical dispersion surfaces 78, 80 and 82 may have an irregularly shaped reflective surface that is configured to disperse electromagnetic energy incident on the surface into alternate reflective modes so as to randomize incident modes of reflected light and produce light modes that may be captured by total internal reflection within the pump cladding 46 of the optical waveguides 42. The reflective dispersion surfaces shown have a somewhat sawtooth configuration, however, any suitable mode dispersion surface may be used. For example, a dispersion surface having a two dimensional matrix of pyramid shaped dimples may be suitable to disperse incident light modes in two dimensions.

Although the embodiment shown in FIGS. 5 and 6 includes a reflective enclosure 56 having six wall portions 64, 66, 68, 70, 72 and 74, each having a reflective surface 62, any suitable subset of these wall portions may be used in their stead and configurations other than the rectangular configuration shown may also be used. For example, in one embodiment, only wall portion 64 at the top of the optical assembly is used with the optical waveguide sections 42 disposed between the elongate linear diode laser arrays 26 and the wall portion 62 having reflective surface 62. Also, any portions of the linear diode laser arrays 26 other than the emission surfaces 32 may include a reflective surface or coating 62 in order to further reflect pumping energy within the reflective enclosure 56.

FIG. 6A illustrates an alternative embodiment of the optical system of FIGS. 5 and 6 wherein the optical waveguide sections are disposed in multiple layers 42A over the linear diode laser arrays 26 between the linear diode laser arrays 26 and the reflective surface 64 or surfaces 64, 66, 68, 70, 72 and 74. Such an arrangement allows pumping electromagnetic energy from the diode laser emitters 28 of the linear diode laser arrays 26 to pass through several optical waveguide sections 42 before being reflected back into the waveguide sections 42 by the reflective surfaces 62. This configuration produces a higher probability of contact with a laseable core 44 prior to reflections within the reflective enclosure 56 which increases the efficiency of the optical system. All other aspects of the embodiment of FIGS. 5 and 6 may otherwise be the same with respect to this alternative optical waveguide configuration. Also, the waveguide sections 42 shown in FIG. 6A can be representative of respective waveguide sections 42 of a plurality of individual waveguides or they may be waveguide sections 42 of a single optical waveguide 42 which has been looped back and forth across the reflective enclosure in order to inject a high amount of pump energy into a single fiber optic laser. These same alternative configurations may be used for any of the optical systems discussed herein.

Figure 7:
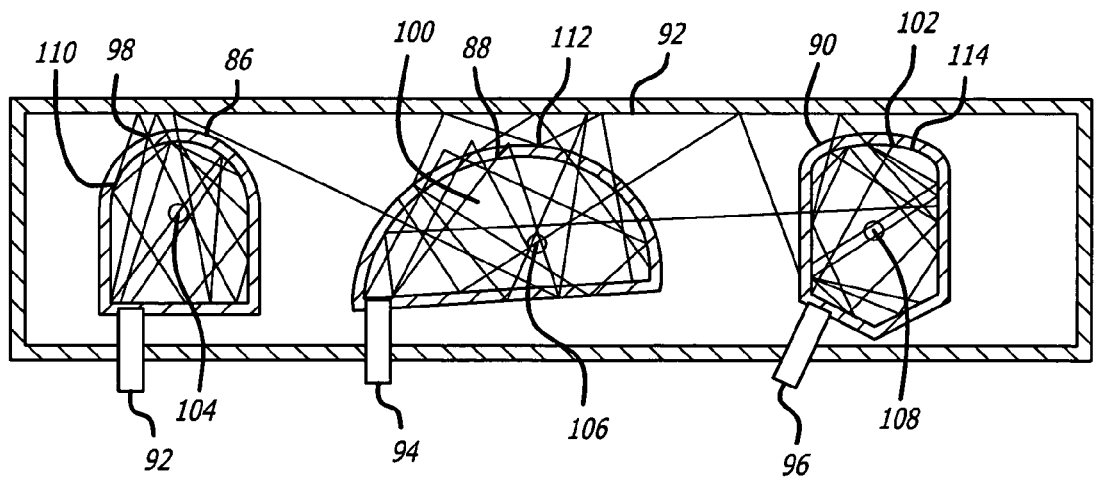
FIG. 7 is a transverse cross sectional view of alternative embodiments of optical waveguides having non-circular irregularly configured transverse cross sections disposed within a reflective enclosure and optically pumped by the respective sources of electromagnetic energy shown.

FIG. 7 shows a transverse cross sectional view of alternative embodiments of elongate optical waveguides 86, 88 and 90 having non-circular irregularly configured transverse cross sections. The transverse cross optical waveguide sections 86, 88 and 90 are shown disposed within a reflective enclosure 92 having a structure and function similar to that of the reflective enclosure 56 discussed above. Each of the elongate optical waveguide embodiments 86, 88 and 90 is shown being optically pumped by respective sources of electromagnetic energy 92, 94 and 96 as shown. The sources of electromagnetic energy 92, 94 and 96 may have dimensions, materials and a configuration that is similar to or the same as those of the linear array of diode lasers 26 discussed above.

The configurations of the transverse cross sections of the elongate optical waveguides 87, 88 and 90, which may be substituted for the circular concentric configuration of the optical waveguides 42 in the embodiments discusses above, prevent the proliferation of helical light modes propagating through the respective pump claddings 98, 100 and 102. Helical propagation modes have the propensity to propagate through the pump cladding of concentrically configured elongate optical waveguides while evading contact with the laseable cores 104, 106 and 108, respectively, therein. The non-circular irregularly shaped cross sections of the elongate optical waveguide embodiments shown in the FIG. 7 serve to mix the modes of the electromagnetic energy or light energy captured by the boundary between the refractive claddings 110, 112 and 114 and the respective pump claddings 98, 100 and 102, and provide for likely or inevitable contact between the light and laseable cores 104, 106 and 108.

Elongate optical waveguide 86 is shown having a somewhat "mailbox-shaped" transverse cross section with a semi-circular surface on top and a flat surface opposite the semi-circular surface. Straight side walls connect the two surfaces. Elongate optical waveguide 88 has a "D" shaped configuration with a semi-circular shaped surface on top completed with a flat surface opposite the semi-circular surface. The elongate laseable core 106 of waveguide 88 is laterally offset with regard to a longitudinal axis (not shown) of the waveguide 88. Elongate waveguide 90 has a semi-circular top surface and a wedge-shaped bottom surface with the top and bottom surfaces connected by two straight side walls. The laseable core 108 of waveguide 90 is only slightly laterally offset with respect to a longitudinal axis of the waveguide (not shown).

Figure 8A:
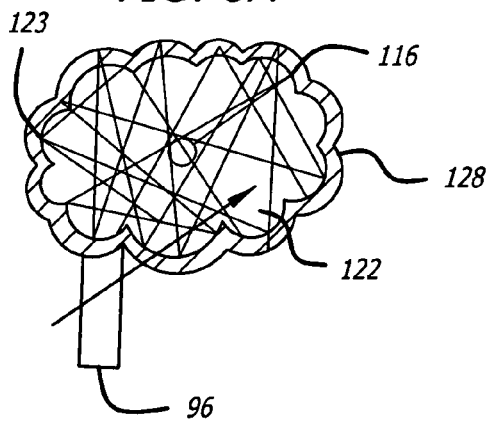
FIGS. 8A–8C show transverse cross sections of additional embodiments of optical waveguides having non-circular irregularly configured transverse cross sections wherein the laseable core of the waveguide may also be offset with respect to a longitudinal axis of the pump cladding of the waveguide and with a source of pumping light shown adjacent each optical waveguide with exemplary light emission rays traced in the pump cladding.
Figure 8B:
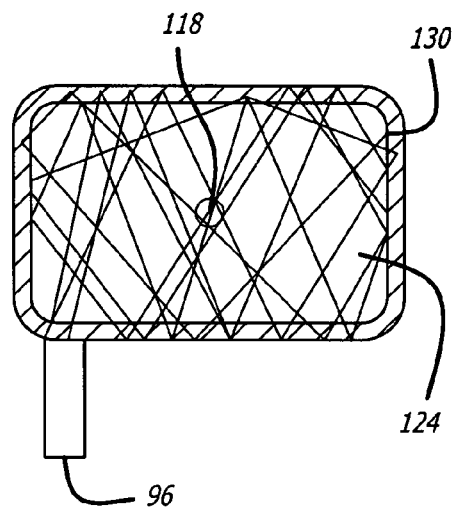
Figure 8C:
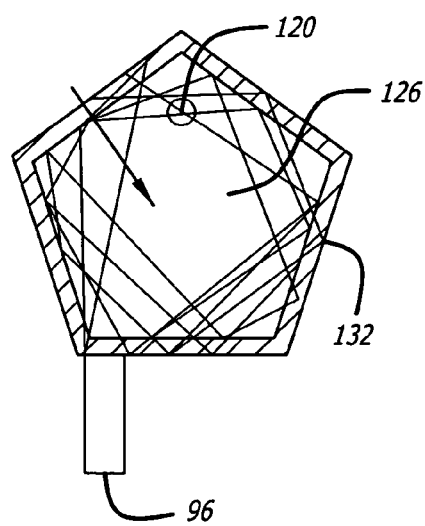
Figure 8D:
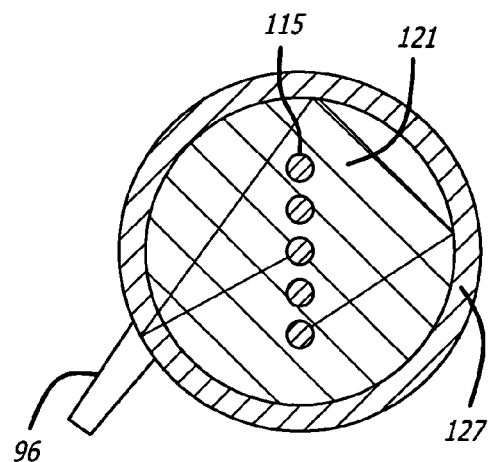
FIG. 8D illustrates a transverse cross sectional view of an embodiment of an optical waveguide having a plurality of laseable cores having longitudinal axes that are substantially parallel and substantially coplanar with the plane defined by the longitudinal axes intersecting a longitudinal axis of the pump cladding of the optical waveguide and with a source of pumping energy shown adjacent the optical waveguide with exemplary light emission rays traced in the pump cladding.

FIGS. 8A–8C show transverse cross sections of additional embodiments of elongate optical waveguides having non-circular configurations with sources of electromagnetic energy or pumping energy 96 disposed adjacent to the optical waveguides. The laseable cores 116, 118 and 120, pump claddings 122, 124 and 126, and refractive claddings 128, 130 and 132 have the same general arrangement as the elongate optical waveguides discussed above. FIG. 8A illustrates an elongate optical waveguide having a transverse cross section with a lobed outer circumference of the refractive cladding 122 with a plurality of lobes 123 configured to mix any helical modes. The laseable core 116 is disposed approximately collinear with a longitudinal axis (not shown) of the elongate waveguide. FIG. 8B illustrates an substantially rectangular shaped transverse cross section with the laseable core substantially collinear with a longitudinal axis of the elongate waveguide. FIG. 8C shows an elongate optical waveguide having a transverse cross section in the shape of a pentagon with the laseable core 120 substantially laterally offset from a longitudinal axis (not shown) of the elongate optical waveguide. FIG. 8D illustrates a transverse cross sectional view of an embodiment of an optical waveguide having a plurality of laseable cores 115 having longitudinal axes that are substantially parallel and substantially coplanar. A plane defined by the longitudinal axes of the laseable cores 115 intersects a longitudinal axis of the pump cladding 121 of the optical waveguide and with a source of electromagnetic energy or pumping light 96 shown adjacent the optical waveguide. Exemplary light emission rays are traced in the pump cladding 121. A refractive cladding 127 is disposed over the pump cladding 121. The plurality of laseable cores 115 disposed in the pump cladding of the optical waveguide provides for enhanced absorption and optical pumping of a laseable core 115 which thereby yields enhanced optical efficiency over single laseable core optical systems. The alternative embodiments of elongate optical waveguides discussed above may be used in any of the embodiments of optical systems discussed herein and combined with any combination of differing configurations for any one optical system.

Figure 9:
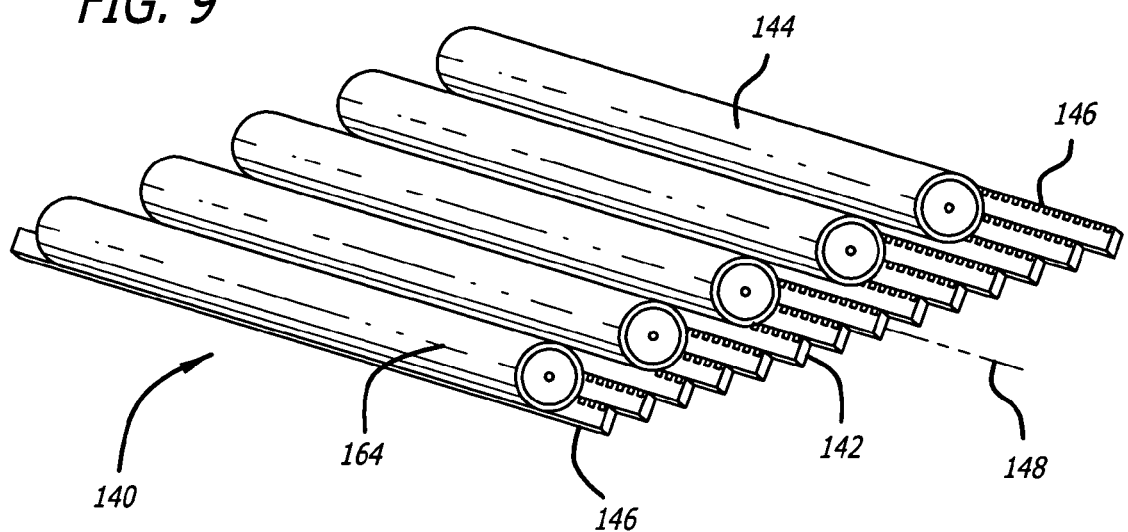
FIG. 9 is a perspective view partially cut away showing a plurality of linear diode laser arrays disposed adjacent five optical waveguide sections wherein the slow axis of the individual diode lasers of the linear diode laser arrays are substantially parallel to the longitudinal axes of the respective optical waveguides.

FIG. 9 is a perspective view of an optical system 140 having a plurality of linear diode laser arrays 142 disposed adjacent five elongate optical waveguide sections 144 wherein planes formed by the slow axis of the individual diode laser emitters 146 and the respective emission axes of the diode laser emitters 146 are substantially parallel to the longitudinal axes 148 of the respective waveguide sections 144.

Figure 10:
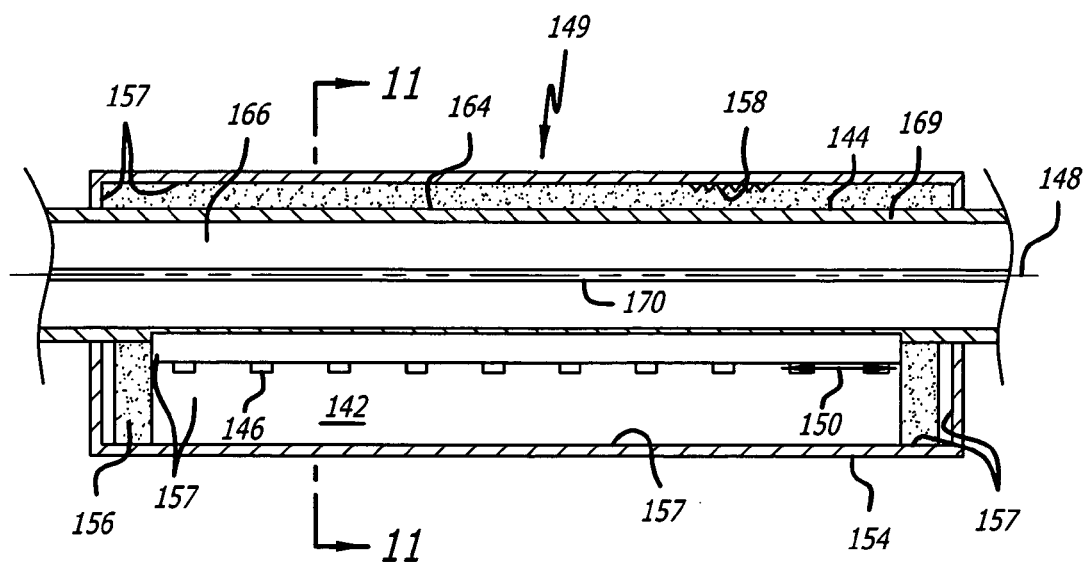
FIG. 10 is an elevational view in partial section and partially cut away showing an optical system including a linear diode laser array disposed adjacent to a section of an optical waveguide having a configuration similar to that of the embodiment of FIG. 9 wherein the slow axis of the individual diode lasers of the linear diode laser array is substantially parallel to the longitudinal axis of the optical waveguide and wherein the linear diode laser array shown and a section of the waveguide shown are enclosed in a reflective enclosure and surrounded by an index material.
Figure 11:
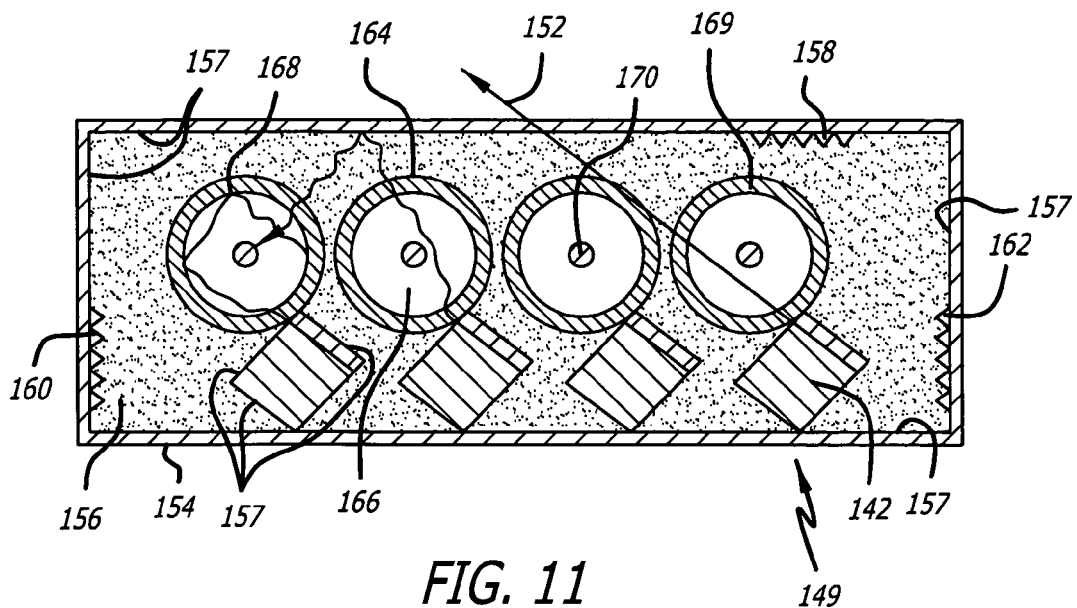
FIG. 11 is a transverse cross section of the optical system of FIG. 10 taken along lines 11—11 of FIG. 10.

FIGS. 10 and 11 show an optical system 149 including linear diode laser arrays 146 disposed adjacent to elongate optical waveguide sections 144 similar to that of FIG. 9 wherein the plane formed by the slow axes 150 of the individual diode laser emitters 146 and the respective emission axes 152 of the diode laser emitters 146 is substantially parallel to the longitudinal axes 148 of the respective waveguide sections 144. The linear diode laser arrays 142 and elongate optical waveguide sections 144 are enclosed in a reflective enclosure 154 and surrounded by an index material 156 disposed within the reflective enclosure 154. The reflective enclosure 154 may have the same or similar materials, dimensions and configurations as those of the reflective enclosure 56 discussed above, including the reflective surface 157 and the configuration of the dispersive reflective surfaces 158, 160 and 162. The elongate optical waveguides 144 may have the same or similar dimensions, materials and configurations as the elongate optical waveguides 42 discussed above.

Electromagnetic energy or light emanating from the diode laser emitters 146 of the linear arrays 142, as indicated by the serpentine ray arrows in FIG. 11, propagates into the lateral outer surface 164 of the elongate waveguide sections 144 and subsequently advances into the pump cladding 166. Once the energy enters the pump cladding 166, it will either remain trapped in the pump cladding 166 by virtue of total internal reflection at the boundary 168 between the pump cladding 166 and the refractive cladding 169, impinge upon the laseable core 170 and be absorbed by the laseable core 170, thereby optically pumping the laseable core 170 or exit the elongate optical waveguide 144 through the refractive cladding 169 and be reflected by the reflective surface 157 of the reflective enclosure 154.

Electromagnetic energy that passes through the elongate optical waveguide 144 and is not captured by total internal reflection at the boundary 168 will still be confined to the reflective enclosure 154 as the top wall, bottom wall, front wall, back wall and side walls of the reflective enclosure 154 all have highly reflective internal surfaces 157. The front and back walls of the reflective enclosure may be sealed to the lateral outer surfaces 164 of the optical waveguide sections 144. Thus electromagnetic energy or light from the diode laser emitters 146 may be confined to the reflective enclosure 154 until it is either absorbed by a component within the enclosure 154 and converted to heat or absorbed by the laseable core 170 and serves to optically pump the laseable core 170. The front and back walls form a seal to the lateral outside surface 164 of the elongate optical waveguide sections 144 in order to confine the electromagnetic energy emanating from the diode laser emitters 146 and to confine the index match material 156 within the reflective enclosure 154. The index match material 156 may be a fluid or liquid and have an index of refraction that is substantially the same as that of the refractive cladding 169 or the material or materials that comprise the outer-most coating of the elongate optical waveguide section 144.

Figure 12:
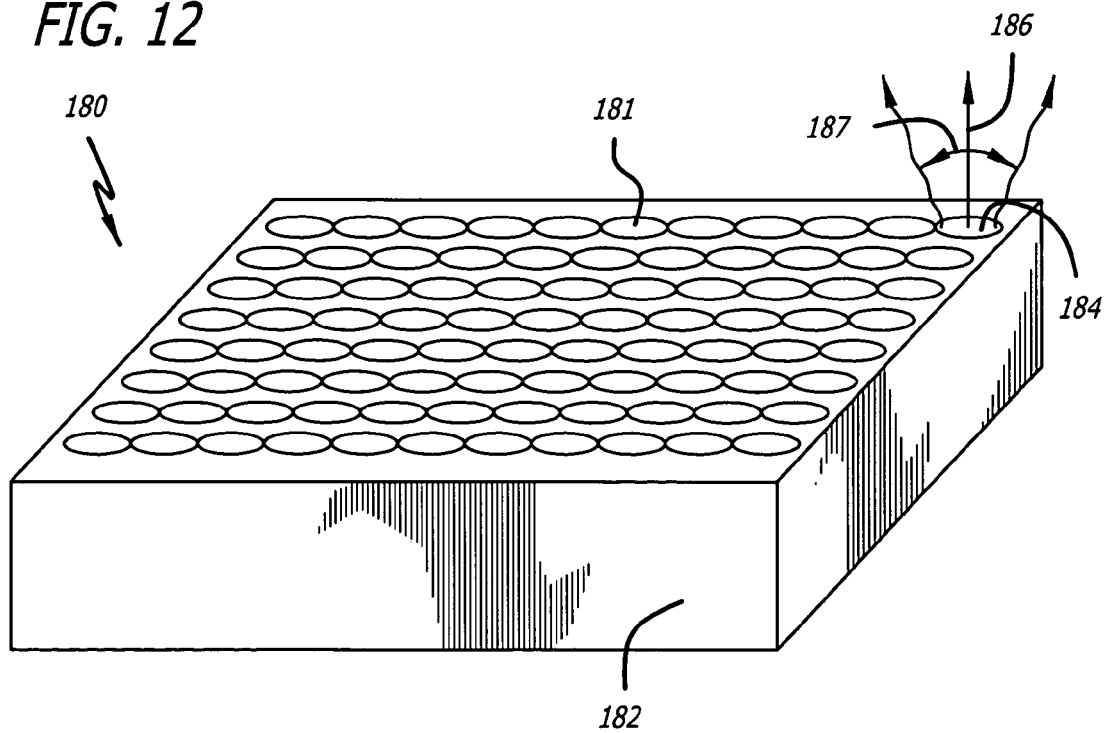
FIG. 12 is a perspective view of a vertical cavity surface emitting laser array having a plurality of individual solid state lasers disposed in a semiconductor substrate material.
Figure 13:
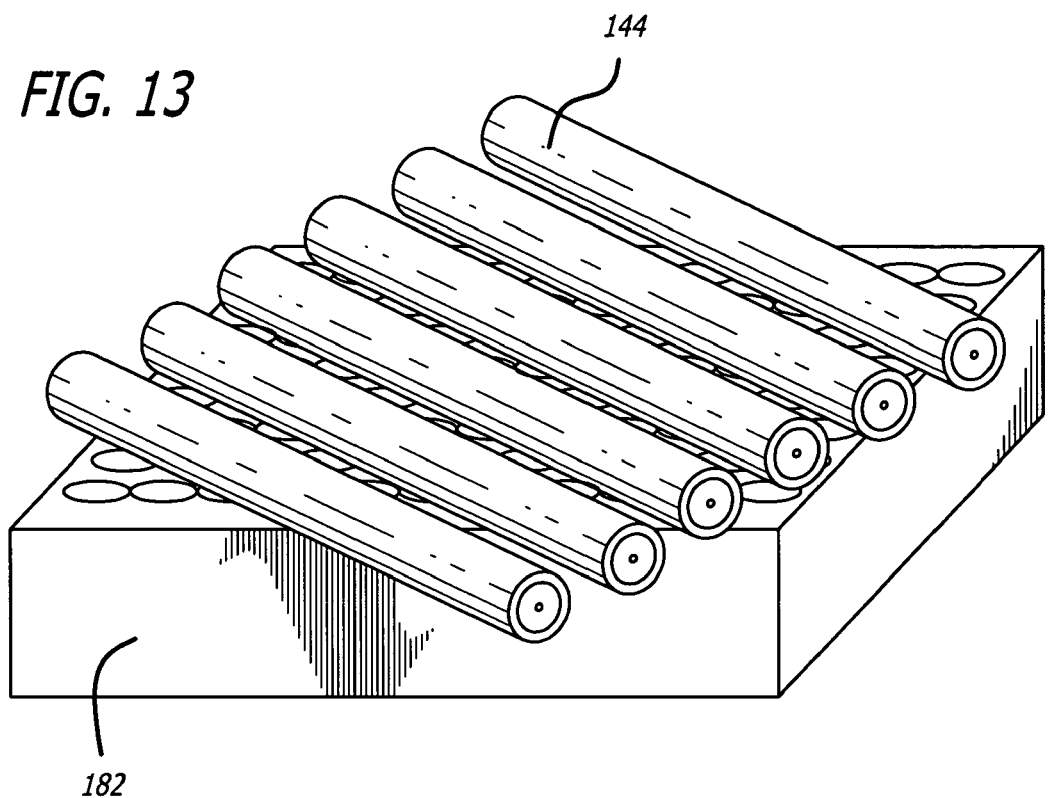
FIG. 13 illustrates the vertical cavity surface emitting diode laser array having several optical waveguide sections disposed over the respective emission axes of the laser array.

FIG. 12 is a perspective view of a vertical cavity surface emitting laser (VCSEL) array 180 having a plurality of individual solid state lasers 181 disposed in a semiconductor substrate material 182 in 8 rows. Each laser cavity has an emission surface 184 with an emission axis 186. FIG. 13 illustrates the VCSEL array 180 with several elongate optical waveguide sections 144, similar to those of FIGS. 9–11 above, disposed over and in contact with emission axes 186 of the VCSEL array 180. The dispersion angle 187 for a typical VCSEL array element is about 3 degrees to about 6 degrees.

Figure 14:
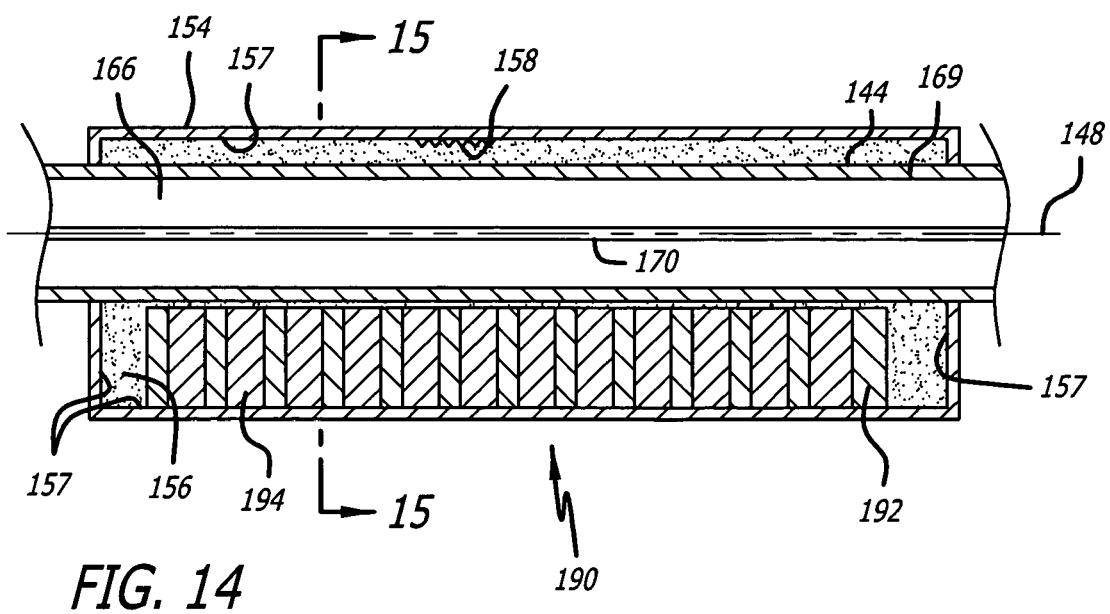
FIG. 14 is an elevational view in partial section and partially cut away of an optical system having a section of an optical waveguide disposed over and in contact with a vertical cavity surface emitting laser array having a configuration similar to that of FIG. 13 wherein the laser array and the optical waveguide sections are enclosed in a reflective enclosure and surrounded by an index material disposed therein.
Figure 15:
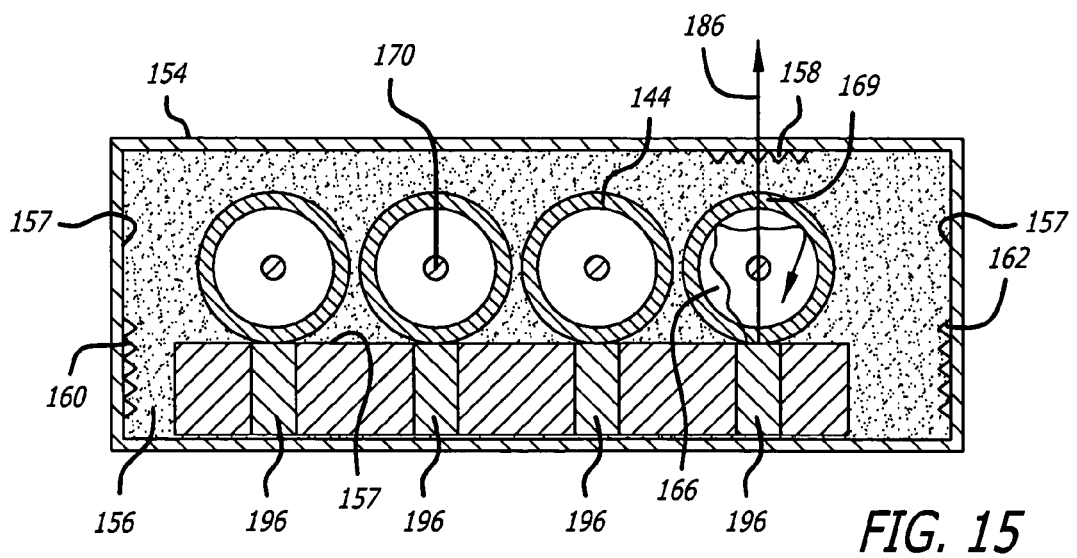
FIG. 15 is a transverse cross sectional view of the optical system of FIG. 14 taken along lines 15—15 of FIG. 14.
Figure 16:
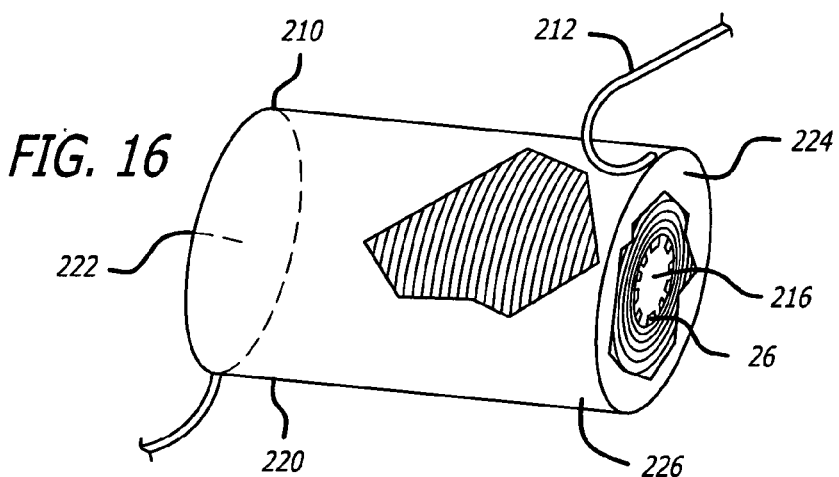
FIG. 16 is a perspective view partially cut away showing an alternative embodiment of an optical system having a section of optical waveguide with a laseable core wrapped about cylindrical mount that includes a plurality of linear diode laser arrays around a circumference of the cylindrical mount with the emission axes of the individual diode lasers directed in an outward radial direction towards the outer lateral surface of the optical waveguide.
Figure 17:
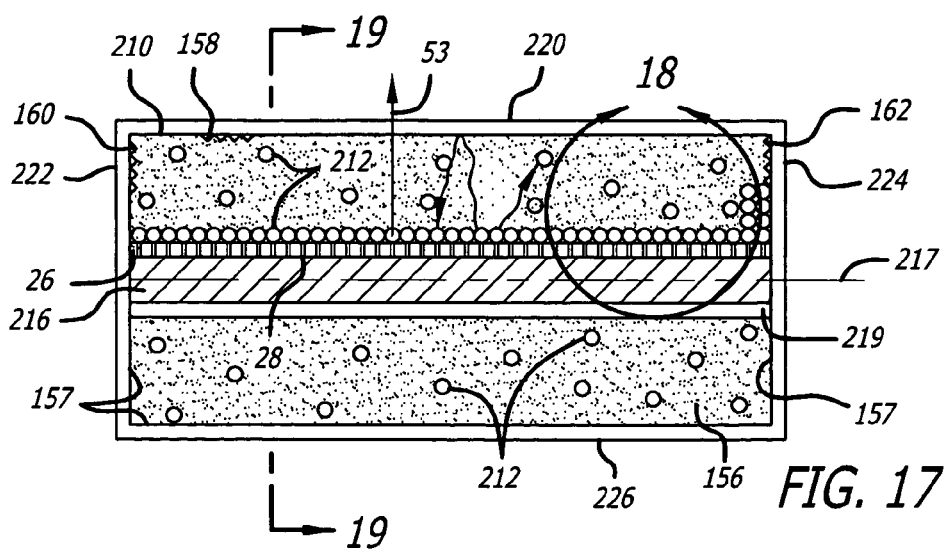
FIG. 17 is an elevational view in longitudinal section of the optical system of FIG. 16.
Figure 18:
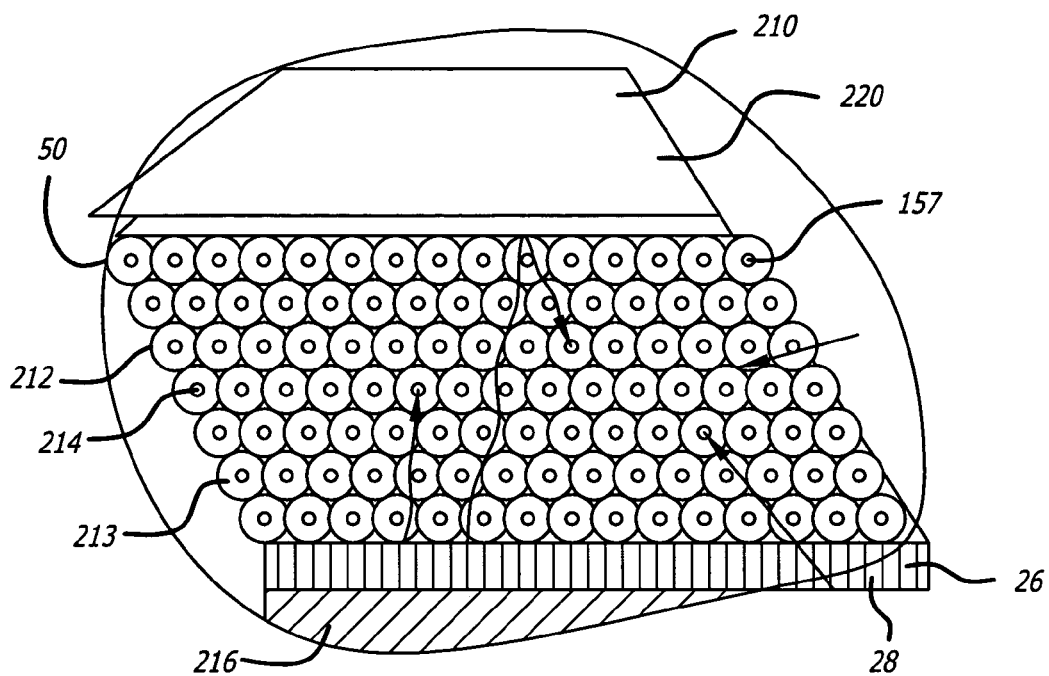
FIG. 18 is an enlarged view of the optical system of FIG. 17 taken at the encircled portion 18—18 of FIG. 17.
Figure 19:
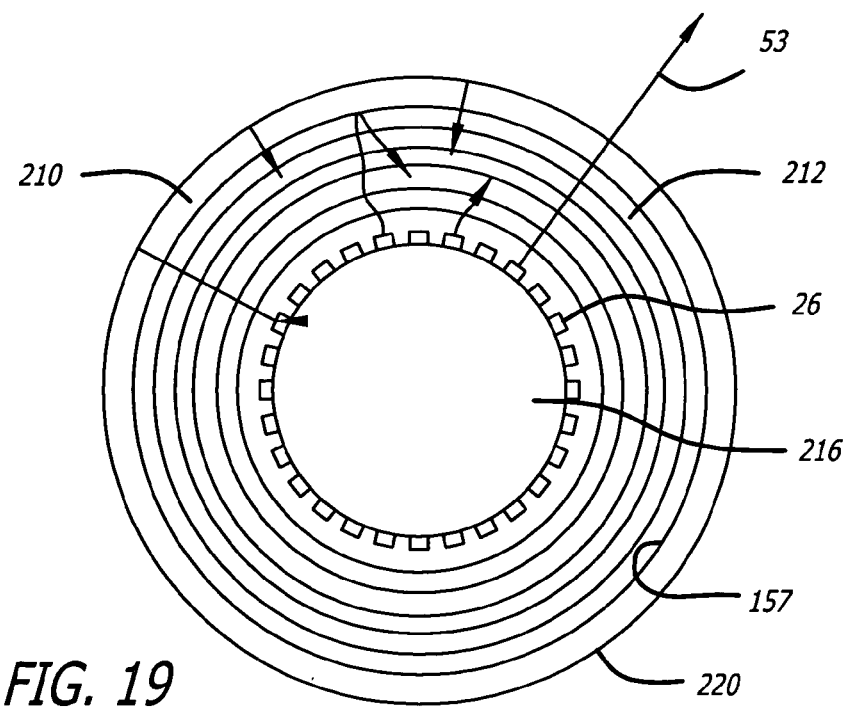
FIG. 19 is a transverse cross section of the optical system of FIG. 17 taken along lines 19—19 of FIG. 17.

FIGS. 14 and 15 show an optical system 190 having elongate optical waveguide sections 144 disposed over and in contact with a VCSEL array 192 similar to that shown in FIG. 13, having a plurality of individual lasers 194 arranged in four rows 196. The elongate optical waveguide sections 144 are disposed respectively over the four rows of individual lasers 194 such that the emission axes 186 of the row of individual lasers 194 corresponding to a particular elongate optical waveguide 144 intersects the longitudinal axis 148 of the respective elongate optical waveguide 144. The dispersion angle 187 of each individual laser 194 is low, as discussed above. Thus, it is particularly useful to include reflective dispersion surfaces 158, 160 and 162 on the reflective surfaces 157 of reflective enclosure 154 in order to disperse the optical modes of the electromagnetic energy from the individual lasers 194 to promote lower modes with respect to the longitudinal axes 148 of the elongate optical waveguides 144 to promote injection of the electromagnetic energy into the pump cladding 166 of the waveguides 144 and achieve total internal reflection therein.

FIGS. 16–19 shows an alternative embodiment of an optical system 210 having a section of optical waveguide 212 with a laseable core 214 wrapped about cylindrical mount 216 that includes a plurality of linear diode laser arrays 26 around a circumference 218 of the cylindrical mount 216. The diode laser arrays 26 are disposed longitudinally parallel to a longitudinal axis 217 of the cylindrical mount 216 on an outer surface 219 of the cylindrical mount 216. The emission axes 53 of the individual diode lasers 28 are directed in an outward radial direction towards the outer lateral surface 50 of the optical waveguide 212 and ultimately to a reflective surface 157 of a cylindrical reflective enclosure 220 that may optionally include an index matching material 156. The cylindrical reflective enclosure has a first side wall portion 222, a second side wall enclosure 224 and an outer cylindrical wall portion 226. The reflective enclosure 220 may have the same or similar materials, dimensions and configurations as those of the reflective enclosure 56 discussed above, including the reflective surface 157 and the configuration of the dispersive reflective surfaces 158, 160 and 162. The elongate optical waveguide 212 may have the same or similar dimensions, materials and configurations as the elongate optical waveguides 42 discussed above.

Electromagnetic energy or light emanating from the diode laser emitters 28 of the linear arrays 26 propagates into the lateral outer surface 50 of the elongate waveguide section 212 and subsequently advances into the pump cladding 213. Once the energy enters the pump cladding 213, it may remain trapped in the pump cladding 213 by virtue of total internal reflection at the boundary between the pump cladding 213 and the refractive cladding disposed about the pump cladding, impinge upon the laseable core 214 and be absorbed by the laseable core 214, thereby optically pumping the laseable core 214. Alternatively, the energy may exit the elongate optical waveguide 212 through the refractive cladding continue on to either be absorbed by another section of the optical waveguide 212 or be reflected by the reflective surface 157 of the reflective enclosure 220.

Electromagnetic energy that passes through the elongate optical waveguide 212 and is not captured by total internal reflection at the boundary by total internal reflection may still be confined within the reflective enclosure 220 as the first side wall 222, second side wall 224 and outer cylindrical wall 226 of the reflective enclosure 220 all have highly reflective internal surfaces 157. Any of the walls of the reflective enclosure 220 may be sealed to the lateral outer surface 50 of the optical waveguide sections 212. Also, any non-emission surfaces of the linear diode laser arrays 26 that are exposed to the optical cavity or enclosure, may also include a highly reflective surface or coating 157. Thus, electromagnetic energy or light from the diode laser emitters 28 may be confined to the reflective enclosure 220 until it is either absorbed by a component within the enclosure 220 and converted to heat or absorbed by the laseable core 214 and serves to optically pump the laseable core 214. The index match material 156 may be a fluid or liquid and have an index of refraction that is substantially the same as that of the refractive cladding 213 or the material or materials that comprise the outer-most coating of the elongate optical waveguide section 212.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the invention. Accordingly, it is not intended that the invention be limited by the forgoing detailed description.

I claim:

1. An optical system, comprising:
   at least one elongate optical waveguide comprising an optical fiber having a first end, a second end, a lateral outer surface, an elongate laseable core disposed therein which is substantially parallel to a longitudinal axis of the elongate optical waveguide and a pump cladding disposed on and completely surrounding the laseable core; wherein a coating is disposed over the pump cladding;
   a source of lateral electromagnetic pumping energy disposed adjacent to the optical waveguide and having an emission axis that is directed toward the lateral outer surface of the optical waveguide; and
   an optically reflective surface disposed towards the lateral outer surface of the optical waveguide containing the laseable core to reflect substantially back toward the laseable core light which escapes the optical waveguide; wherein the reflective surface further comprises an optical dispersion surface that disperses laterally directed electromagnetic pumping energy that impinges on the dispersion surface into longitudinally directed modes.

2. The optical system of claim 1 wherein the reflective surface is configured as an enclosure disposed about at least a portion of the at least one elongate optical waveguide and wherein the optical system further comprises an index matching material disposed within the enclosure and in contact with at least a portion of the lateral outer surface of the at least one optical waveguide.

3. The optical system of claim 2 wherein the index matching material is selected from the group consisting of chlorofluorocarbon refrigerants, ethylene glycol, electronic coolants such as Fluorinert™, poly-alpha olefins, alcohols, perchloroethylene and carbon tetrachloride.

4. The optical system of claim 2 wherein the at least one optical waveguide comprises about 5 to about 25 optical waveguides.

5. The optical system of claim 2 wherein the coating comprises a polymer.

6. The optical system of claim 5 wherein the polymer comprises acrylic.

7. The optical system of claim 2 wherein the pump cladding comprises silica glass.

8. The optical system of claim 7 wherein the pump cladding comprises fluorine doped silica glass.

9. The optical system of claim 2 wherein the laseable core has a substantially circular transverse cross section.

10. The optical system of claim 9 wherein the pump cladding has a substantially circular transverse cross section.

11. The optical system of claim 10 wherein a longitudinal axis of the laseable core is disposed eccentrically with respect to a longitudinal axis of the pump cladding.

12. The optical system of claim 2 wherein the pump cladding has a non-circular irregularly configured transverse cross section.

13. The optical system of claim 1 wherein the reflective surface comprises a flat surface.

14. The optical system of claim 1 wherein the reflective surface comprises at least one section having a concave surface configuration.

15. The optical system of claim 1 wherein the source of lateral electromagnetic pumping energy comprises a linear array of diode lasers wherein the emission axis of each of the diode lasers is substantially parallel and directed toward the at least one elongate optical waveguide.

16. The optical system of claim 15 wherein the linear array of diode lasers are disposed along a longitudinal length of an elongate substrate.

17. The optical system of claim 1 wherein the source of lateral electromagnetic pumping energy comprises a solid state diode laser.

18. The optical system of claim 17 wherein the solid state diode laser comprises an edge emitting diode laser.

19. The optical system of claim 18 wherein the diode laser is oriented with the fast axis aligned with the longitudinal axis of the waveguide.

20. The optical system of claim 18 wherein the diode laser is oriented with the slow axis substantially aligned with the longitudinal axis of the waveguide.

21. The optical system of claim 17 wherein the solid state diode laser comprises a vertical cavity surface emitting laser.

22. The optical system of claim 1 wherein the emission axis of the source of electromagnetic energy forms an incidence angle with a longitudinal axis of the optical waveguide of about 42 degrees to about 90 degrees.

23. The optical system of claim 1 wherein the laseable core comprises doped silica glass.

24. The optical system of claim 23 wherein the doped silica glass of the laseable core comprises a rare earth ion.

25. The optical system of claim 1 further comprising a Bragg grating disposed at one end of the at least one optical waveguide which is configured to selectively reflect a lasing wavelength of the laseable core of the waveguide.

26. An optical system, comprising
at least one elongate optical waveguide having a first end, a second end, a lateral outer surface, an elongate laseable core disposed therein which is substantially parallel to a longitudinal axis of the elongate optical waveguide and a pump cladding disposed on the laseable core;
a source of electromagnetic pumping energy disposed adjacent to the optical waveguide and having an emission axis that is directed toward the lateral outer surface of the optical waveguide;
an optically reflective surface disposed towards the lateral outer surface of the optical waveguide and configured as an enclosure disposed about at least a portion of the at least one optical waveguide; and
an index matching material disposed within the enclosure and in contact with at least a portion of the optical waveguide.

27. A method of lasing a laseable core, comprising
providing an optical system having
at least one elongate optical waveguide having a first end, a second end, a lateral outer surface, an elongate laseable core disposed therein which is substantially parallel to a longitudinal axis of the elongate optical waveguide and a pump cladding disposed on the laseable core,
a source of electromagnetic pumping energy disposed adjacent to the optical waveguide and having an emission axis that is directed toward the lateral outer surface of the optical waveguide,
an optically reflective surface disposed towards the lateral outer surface of the optical waveguide and configured as an enclosure disposed about at least a portion of the at least one optical waveguide, and
an index matching material disposed within the enclosure and in contact with at least a portion of the optical waveguide; and
energizing the source of electromagnetic pumping energy such that electromagnetic pumping energy travels from the source of electromagnetic pumping energy and penetrates the lateral outer surface of the optical waveguide.

28. The method of claim 27 wherein the source of electromagnetic pumping energy comprises a diode laser and energizing the source of electromagnetic pumping energy comprises applying electrical energy to the diode laser.

* * * * *